(12) United States Patent
Raniere

(10) Patent No.: US 9,114,753 B2
(45) Date of Patent: Aug. 25, 2015

(54) APPARATUS AND METHOD FOR PREVENTING A VEHICLE FROM RUNNING OUT OF FUEL

(71) Applicant: FIRST PRINCIPLES, INC., Albany, NY (US)

(72) Inventor: Keith A. Raniere, Clifton Park, NY (US)

(73) Assignee: FIRST PRINCIPLES, INC., Albany, NY (US)

(*) Notice: Subject to any disclaimer, the term of this patent is extended or adjusted under 35 U.S.C. 154(b) by 0 days.

(21) Appl. No.: 13/840,409

(22) Filed: Mar. 15, 2013

(65) Prior Publication Data

US 2014/0277920 A1    Sep. 18, 2014

(51) Int. Cl.
*F02P 5/00* (2006.01)
*B60Q 9/00* (2006.01)

(52) U.S. Cl.
CPC ........................................ *B60Q 9/00* (2013.01)

(58) Field of Classification Search
None
See application file for complete search history.

(56) References Cited

U.S. PATENT DOCUMENTS

| | | | |
|---|---|---|---|
| 2,867,698 A | 1/1959 | Gondolfo | |
| 3,699,995 A | 10/1972 | Brandt | |
| 4,292,620 A * | 9/1981 | Pagane | 180/287 |
| 5,559,491 A * | 9/1996 | Stadler | 340/426.25 |
| 5,995,886 A | 11/1999 | Tanaka et al. | |
| 6,072,248 A * | 6/2000 | Muise et al. | 307/10.2 |
| 6,175,772 B1 | 1/2001 | Kamiya et al. | |
| 6,313,740 B1 * | 11/2001 | Goetz | 340/426.23 |
| 7,019,656 B2 | 3/2006 | Bair, III et al. | |
| 7,305,194 B2 * | 12/2007 | Thayer | 399/49 |
| 7,581,457 B2 * | 9/2009 | Bussu | 73/865.6 |
| 2001/0056544 A1 * | 12/2001 | Walker | 713/200 |
| 2002/0111116 A1 | 8/2002 | Rudell et al. | |
| 2006/0112622 A1 | 6/2006 | Solak | |
| 2009/0174682 A1 * | 7/2009 | Bowden et al. | 345/173 |
| 2010/0048096 A1 * | 2/2010 | Lorelli et al. | 446/456 |
| 2010/0145638 A1 * | 6/2010 | Begin | 702/55 |
| 2011/0140877 A1 * | 6/2011 | Gilchrist et al. | 340/450.2 |
| 2013/0022890 A1 * | 1/2013 | Kundu et al. | 429/480 |

FOREIGN PATENT DOCUMENTS

FR        2793212  A1    11/2000

* cited by examiner

*Primary Examiner* — John R Olszewski
*Assistant Examiner* — James M McPherson
(74) *Attorney, Agent, or Firm* — Schmeiser, Olsen & Watts, LLP

(57) ABSTRACT

An apparatus for use with a motor vehicle to simulate fuel loss to encourage early refueling to prevent stranding. The apparatus may cause stumbling and hesitation by interrupting various engine management systems to simulate low fuel in the tank by cutting either spark or fuel momentarily or applying the brakes.

20 Claims, 5 Drawing Sheets

APPARATUS AND METHOD FOR PREVENTING A VEHICLE FROM RUNNING OUT OF FUEL

FIELD OF THE TECHNOLOGY

The present invention relates to an apparatus and method for preventing a vehicle from running out of fuel.

BACKGROUND

A vehicle may run out of fuel if the driver is preoccupied or forgetful to refuel. An operator may be left stranded far from any location where he can obtain more fuel. Currently, vehicles contain a fuel gauge which displays the level of fuel for an operator to attempt to prevent this unfortunate scenario. However, a fuel gauge on a vehicle may read empty when there is still fuel remaining in the vehicle. This may condition the operator to disregard the warning and continue to drive the vehicle, sometimes to the point where the fuel actually does run out.

SUMMARY

A first aspect of the present invention provides an apparatus to simulate fuel loss to a motor comprising: a fuel level monitor; and a device in communication with said monitor, wherein said device simulates fuel loss conditions when said monitor measures fuel to be at a predetermined fuel level.

A second aspect of the present invention provides a device for imitating the effect of fuel loss to a motor comprising: a sensor wherein said sensor measures a volume of fuel present in a fuel tank; a microprocessor in communication with said sensor wherein said microprocessor is activated when the fuel volume measured by said sensor reaches a predetermined value; a speaker in communication with said microprocessor, said speaker with an audible output simulating engine fuel loss; and a fuel gauge in communication with said microprocessor wherein said fuel gauge is adjusted to display that said fuel tank is empty when the volume of fuel present is below said predetermined value.

A third aspect of the present invention provides a method for simulating the effect of a motor vehicle running out of fuel comprising: providing a device in communication with a motor vehicle, having an engine and a fuel level sensor; and simulating fuel starvation with said device to said engine at a predetermined fuel level to encourage refueling.

DETAILED DESCRIPTION

Figure 1:
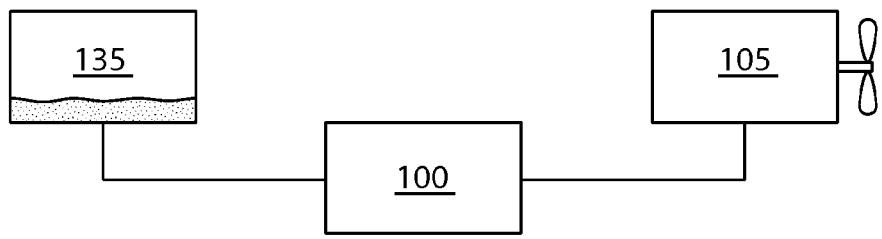
FIG. 1 shows the basic invention configuration.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of and embodiment. The features and advantages of the present invention are illustrated in detail in the accompanying drawings, wherein like reference numerals refer to like elements throughout the drawings.

Therefore, the instant invention addresses the problem of running out of fuel by providing a further warning in addition to the fuel gauge to prevent a vehicle from running out of fuel and stranding the operator. The instant invention provides a physical stimulus to the occupant of a motor vehicle simulating fuel loss by providing a feedback at a predetermined fuel level. One embodiment as shown in FIG. 1 is an apparatus 100 to simulate fuel loss to a motor 105 is shown having a fuel level monitor 110 that may be located within a fuel tank 135. Apparatus 100 may be included in a vehicle 101. The vehicle 101 may be a car, truck, van, bus, golf cart, go-cart, scooter, moped, motorcycle, airplane, or any other vehicle used for the transportation of people or objects.

Figure 2:
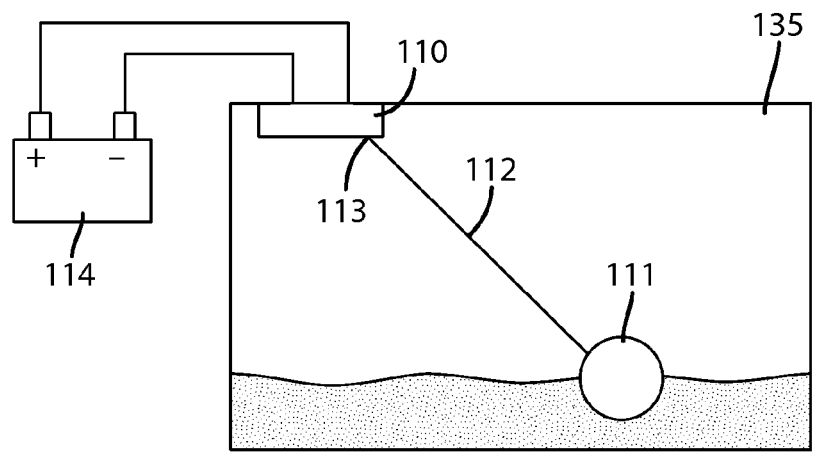
FIG. 2 shows a fuel sender of a vehicle.

As shown in FIG. 2, the fuel level monitor 110 may be any means of measuring the current volume of fuel present in the fuel tank 135 so that an approximation of the fuel remaining is known. The fuel monitor 110 may be a float on an arm that is attached to a rheostat that has a resistance that is attributed to a position of the float. The resistance effects the voltage output of the fuel level monitor 110 to show a range of remaining fuel.

Figure 3:
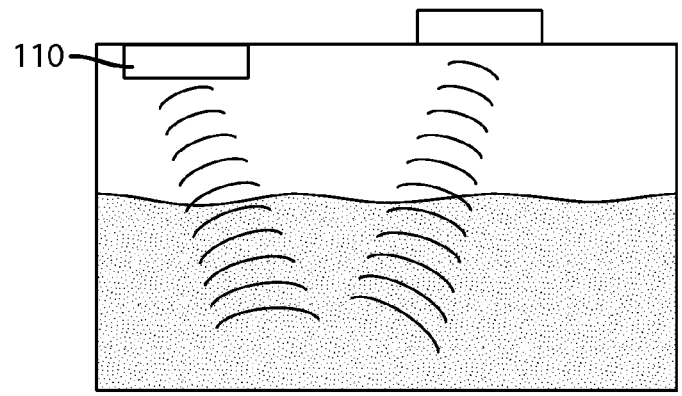
FIG. 3 shows a fuel level sensor embodiment.

As shown in FIG. 3, the fuel level monitor 110 may also be in the form of an ultrasonic level meter 110 with a transducer to measure level and distance in liquids. The fuel level monitor 110 may be a hydrostatic tank gauging (HTG), which can provide accurate information on tank level, mass, density, and volume of the contents in every tank which is affected by temperature. The fuel level monitor 110 may also be a sensor to measure the level as it is a density/pressure (DP) transmitter that measures hydrostatic pressure for level measurement. Another fuel level monitor 110 may use a pressure transmitter in the form of a probe that is simply lowered into the tank toward the bottom. The fuel level monitor 110 may also be a microwave based, which uses a technology called frequency-modulated continuous wave (FMCW), which has an electronic module on top of the tank has a sensor oscillator that sends down a linear frequency sweep, at a fixed bandwidth and sweep time. The reflected radar signal is delayed in proportion to the distance to the level surface. Its frequency is different from that of the transmitted signal, and the two signals blend into a new frequency proportional to distance that is converted into a very accurate measure of liquid level.

Motor 105 may be configured to run on fuel such as gasoline, diesel, bio-diesel, E85 (85 percent ethanol and 15 percent gasoline), liquified propane, liquified natural gas or any other alternate form of fuel having a storage tank may be located in the vehicle 101. The motor 105 may be in the form of a reciprocating piston engine, rotary engine, turbine engine or even hybrid gas engine, or an electric vehicle based off electricity from a fuel cell. The aforementioned examples of motors 105 all have refillable energy storage containers that are utilized to run the engine or motor 105, but this concept may include electric vehicles having an electric motor and solely an electrical charge in a battery to motivate the user to charge before being stranded.

The monitor 110 may be positioned in a fuel tank 135 and contain a float 111. This monitor may be located within fuel tank 135 with the float 111 connected to a metal rod 112 at the distal end as displayed in FIG. 2. At the other end of the rod may be a rheostat which changes the resistance of an effective resistor 113 which is connected to a battery 114, thus changing the resistance as the level of fuel changes the position of the float 111. Regardless of which style monitor 110 or sensor is used to determine the remaining level or volume of fuel present in the tank an appropriate set point to refuel should be set based on either miles or volume of fuel.

To ensure that the vehicle does not become stranded because of a low remaining fuel volume the average mileage of a vehicle must be considered. A safe distance to allow refueling may be considered to be 50 miles in the suburbs, which could be adjustable from a range of 10 to 100 miles for more rural communities. The fuel economy of a vehicle may range from a low of 5 MPG for large gasoline powered vehicle towing heavy loads, such as when powered by an 8.0 liter or larger gas motor as popular on commercial pickup trucks up to 75 MPG for small diesel or hybrid-gas economy cars. Thus the desired refueling range is divided by the average MPG for the refueling range, for example for a 75 mile range allowance in a diesel economy car having an average fuel economy of 75 MPG equals 1 gallon. For example, with the diesel economy car that has a fuel tank with an eight gallon capacity with only one gallon remaining it should register empty on the gauge viewed by the driver. This calculation can be performed by the microprocessor 115 that could continuously monitor the fuel economy of the vehicle 101.

Figure 4:
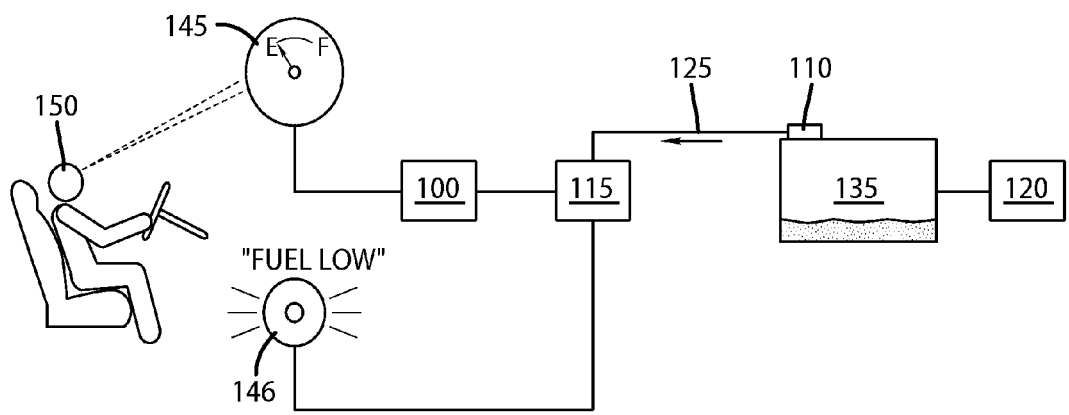
FIG. 4 shows an embodiment where the driver is alerted by a speaker when fuel is low.

As shown in FIG. 4 a device 115 is in communication with monitor 110. Device 115 may be a microprocessor, and also may be programmable to act in a manner to simulate fuel loss. Device 115 begins to simulate fuel loss conditions when monitor 110 measures fuel to be at a predetermined fuel level 120 within fuel tank 135. Monitor 110 conveys the remaining volume of fuel in tank 135 to device 115 through a signal 125. The signal 125 may control the gauge to show an empty fuel tank condition while sufficient reserves are present to enable driving to a station for refueling of the vehicle. When the gauge 145 shows an empty condition 120 the device may immediately initiate fuel loss conditions or it could wait for a secondary initiator 131.

Figure 5:
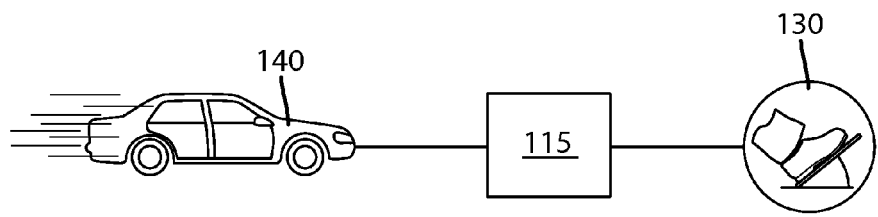
FIG. 5 shows an embodiment where an accelerator sensor and inclinometer are connected to the microprocessor.

As shown in FIG. 5, the apparatus 100 may also contain an incline sensor 130 which is in communication with device 115 that can also be utilized as a secondary initiator 131. Incline sensor 130 may help determine if the incline of tank 135 is affecting the level of fuel that monitor 110 measures. Additionally the incline sensor 130 may be a secondary initiator that would commence imitation of a fuel loss condition. If float 111 is located on a side 136 of tank 135 experiencing an incline, the height of float 111 with respect to the bottom 137 of tank 135 will be affected, thereby affecting the level of fuel that monitor 110 measures.

The apparatus 100 may contain an accelerometer 140 in communication with device 115. The accelerometer 140 may also be uses as a secondary initiator to trigger fuel loss simulation. Additionally, the accelerometer 140 may help determine if the acceleration of tank 135 is affecting the level of fuel that monitor 110 measures. For example, if tank 135 is accelerated, the distribution of fuel in tank 135 will be affected, thus affecting the level of fuel under float 111. The device 115 may also use the incline sensor 130 and the accelerometer 140 after the predetermined fuel level has been reached to initiate a condition of simulated fuel loss. Examples of use of the incline sensor 130 and the accelerometer 140 sensors may be used to initiate the simulation of fuel loss when the driver attempts to accelerate quickly or climb a large hill thus mimicking the fuel pump aerating the gasoline when the tank is nearly empty due to fuel sloshing.

Device 115 may include a program to calibrate signal 125 to correspond to an actual fuel level in fuel tank 135, which may be different than some current vehicles that may show more fuel present on the gauge than the actual level in the tank to convince the driver that the car is more fuel efficient. This adjustment may occur using incline sensor 130 and accelerometer 140 that would calculate the effect of fuel signal during driving. Additionally, device 115 may also be programmed to damp any fast changes in the output signal 125 due to the sloshing around of fuel in tank 135. The program may do this by calculating the average of several signals 125 over time.

Apparatus 100 may also contain a fuel gauge 145 in communication with device 115. Fuel gauge 145 may indicate that fuel tank 135 is empty when it actually contains predetermined level of fuel 120. This allows apparatus 100 to trick a operator 150 who is looking at fuel gauge 145 into believing that fuel tank 135 is already empty. Fuel gauge 145 may indicate the fuel level by a needle, by a numerical display, or may even use a light to indicate that tank 135 is empty. A voice alarm stating "fuel level low" or other similar message may flash or be made over audio speakers in combination with a fuel loss simulation or just before onset of the fuel loss simulation as in FIG. 4.

Figure 6:
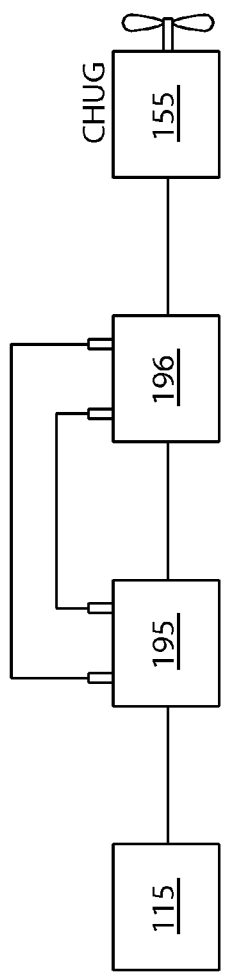
FIG. 6 shows an embodiment where energy is interrupted from the coil.

As shown in FIG. 6, the device 115 may intermittently interrupt the power to an ignition system 155 to mimic fuel starvation to motor 105 when monitor 110 measures fuel to be at predetermined level 120, which may cause minor shuttering or hesitation. This may be done with an ignition relay switch 195 to cut off the high voltage ignition either at the coil or power feed to the coil 196. With the power to the ignition interrupted, the sparks plugs will not spark momentarily and the engine will no longer function for a period of a few microseconds up a full second. Therefore, intermittently interrupting the power supply to the ignition system coil 196 will cause vehicle 101 to hesitate, lurch and sputter.

Figure 7:
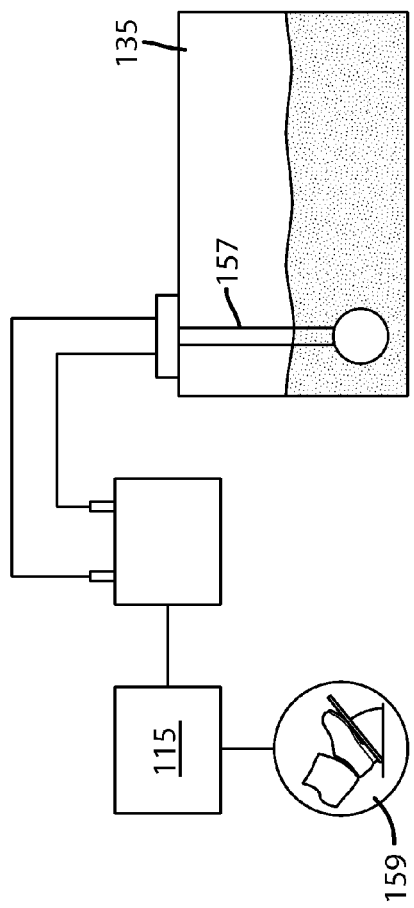
FIG. 7 shows an embodiment where the energy to the fuel pump is interrupted.

As shown in FIG. 7, the device 115 may also shut off power momentarily to the fuel pump 157 causing actual loss of fuel. The device may be connected to a fuel shut off solenoid 158 that would shut off for either a single moment for a pause of a duration of 0.2 to 2 seconds causing immediate lack of power and deceleration. This may be done in connection with either the Throttle Position Sensor (TPS) 159 or the accelerometer 140 to initiate the fuel pump shutoff. The fuel shut off solenoid 158 may be shut off in short bursts to produce bucking. The fuel pump may not be shut off in motors that are turbocharged when under boost to prevent damage.

Figure 8:
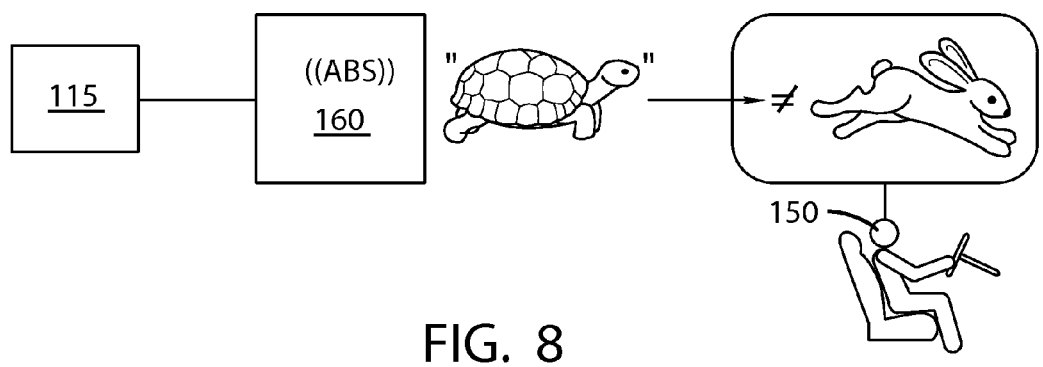
FIG. 8 shows where ABS brakes are applied to make the car slow when the gas pedal was applied and the driver anticipated acceleration.

In FIG. 8, as displayed modern ABS systems 160 that have the ability to assist in traction control brakes may be applied by the cars computer to aid in traction or improve corner handling without the driver even applying pressure to the brakes by including a pressure creating device in the system to apply braking pressure without driver's touching the brakes. Device 115 may modulate the modern ABS brake system 160 to initiate unintended braking impulses to mimic fuel starvation to motor 105 when monitor 110 measures fuel to be at predetermined level 120. For example, if brake system 160 is a digital anti-lock brake system (ABS) then device 115 may intercept the digital signal or create a digital signal to initiate unexpected braking. This will also cause vehicle 101 to falter or slow down as though it was running out of fuel.

Figure 9:
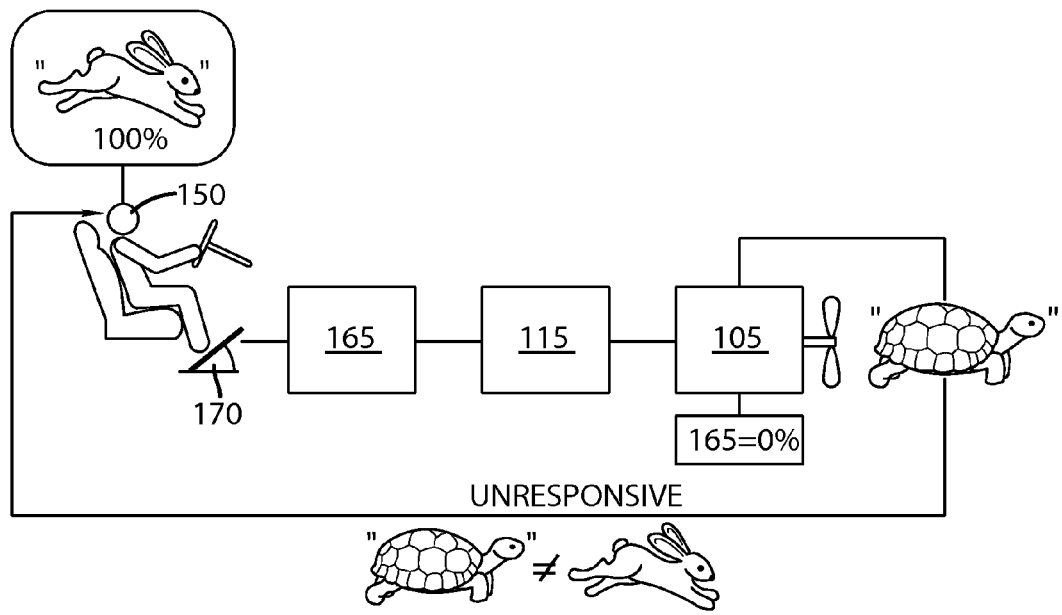
FIG. 9 is an embodiment where the accelerator is at full throttle, but the throttle body is closed causing what is perceived to be hesitation by the driver.

As shown in FIG. 9, the device 115 may also override a throttle pedal signal 165 of a throttle pedal 170 causing a throttle body 175 to reduce the amount of air to motor 105 to mimic fuel starvation to motor 105 (in the form of power loss) when monitor 110 measures fuel to be at predetermined level 120 in fuel tank 135. Device 115 may intercept the digital signal, for example, sent by throttle pedal 170 to throttle body 175. Device 115 may instead promulgate a signal to throttle body 175 that causes substantially less, or no air to motor 105. This may cause vehicle 101 to be unresponsive to an operator 150 who compresses throttle pedal 170, simulating vehicle 101 running out of fuel.

Figure 10:
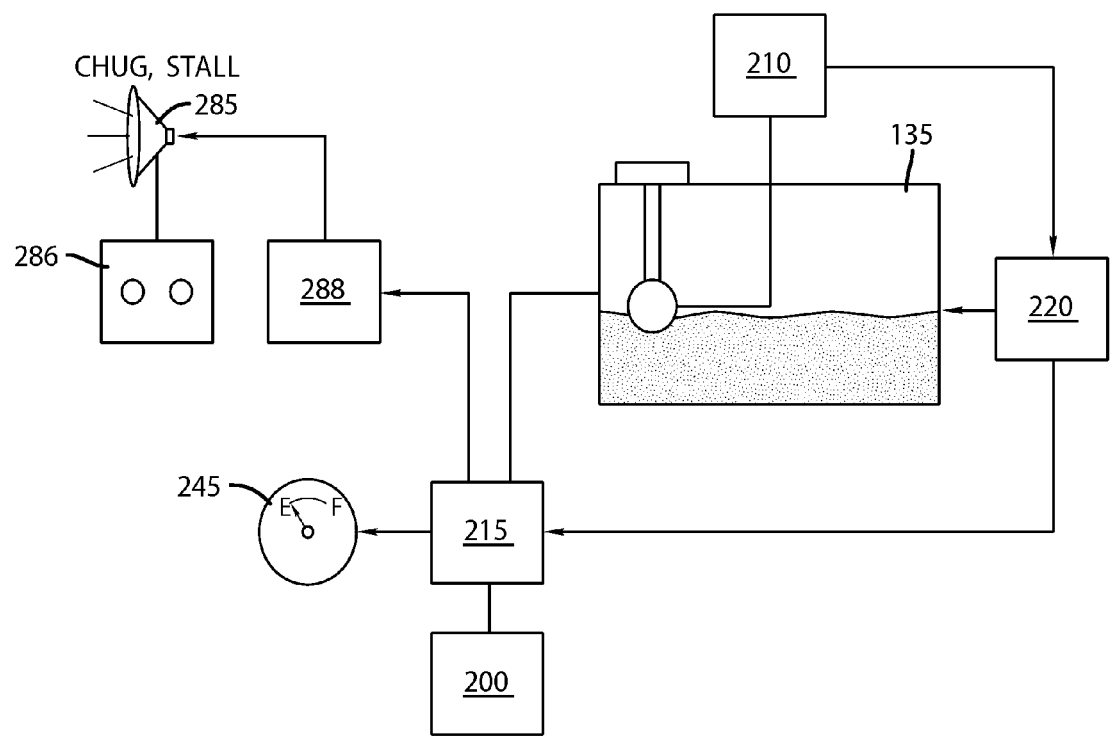
FIG. 10 is an embodiment where sounds are produced when gas level is at a predetermined level.

In another embodiment as shown in FIG. 10, a device 200 for imitating the effect of fuel loss to engine 205 comprises a sensor 210 which measures a volume of fuel present in a fuel tank 235. Engine 205 may be configured to run on fuel such as ordinary gasoline, diesel, biodiesel, E85 (85 percent ethanol and 15 percent gasoline), hydrogen, or any other alternate form of fuel and may be located in a vehicle 201. Vehicle 201 may be a car, truck, van, bus, golf cart, go-cart, motorcycle, airplane, or any other vehicle used for the transportation of people or objects. Sensor 210 may contain a float in connection to a variable resistor, or may be a pressure sensor connected to a mercury manometer.

A microprocessor 215 is in communication with sensor 210 wherein microprocessor 215 is activated when the fuel volume measured by sensor 210 reaches a predetermined value 220. Predetermined value 220 is preferably greater than zero so that an operator 150 has time to respond to the activation of microprocessor 215. Additionally a speaker 285 is also in communication with microprocessor 215 and speaker 285 has an audible output simulating fuel loss to engine 205. Speaker 285 may be integrated into the audio system 286 of a vehicle 201, or may be a separate speaker only used by device 200. Additionally, the audio output may actually be a silent override of the audible output of the audio system 286 of vehicle 201. The sounds emulating a stalling engine may be stored on a compact disk, a cassette, a hard drive or any other media storage device.

In this embodiment, a fuel gauge 245 is in communication with microprocessor 215 and is adjusted to display that the fuel tank 235 is empty when the volume of the fuel present is below the predetermined value 220. This allows device 200 to trick a operator 150 who is looking at fuel gauge 245 into believing that fuel tank 235 is empty. Fuel gauge 245 may indicate the fuel level by a needle, by a numerical display, or may even use a light to indicate that tank 235 is empty.

Additionally, device 200 may also contain a throttle 275 of engine 205 in communication with microprocessor 215. When the volume of fuel present in fuel tank 235 reaches predetermined value 220, microprocessor 215 alters an electrical signal 265 to throttle 275 causing throttle 275 to reduce airflow to engine 205 to mimic power loss from fuel starvation. This may cause vehicle 201 to be unresponsive to an operator 150 who compresses throttle pedal 270, simulating vehicle 101 running out of fuel.

Furthermore, device 200 may comprise an ignition system 255 of engine 205 in communication with microprocessor 215. When the volume of fuel present in the fuel tank 235 reaches predetermined value 220, microprocessor 215 may intermittently interrupt the electrical power to ignition system 255 to simulate loss of fuel. This may be done with a relay switch 295. With the power to the ignition interrupted, the sparks plugs will not spark and the engine will no longer function. Therefore, intermittently interrupting the power supply to the ignition system will cause vehicle 201 to hesitate, lurch and sputter.

In a further embodiment, a method 300 for simulating the effect of a motor vehicle 301 running out of fuel comprises providing a device 315 in communication with motor vehicle 301 having an engine 305 and a fuel level sensor 310. Device 315 may be a microprocessor. Fuel level sensor 310 may be a float connected to a variable resistor, or a mercury manometer. Motor vehicle 301 may be a car, truck, van, bus, golf cart, go-cart, motorcycle, airplane, or any other vehicle with a motor that is used for the transportation of people or objects and needs to be refueled.

Additionally, method 300 comprises simulating fuel starvation with device 315 to engine 305 at a predetermined level 320 to encourage refueling. Predetermined level 320 may be at some level greater than zero to give operator 150 time to travel in vehicle 301 to a location to commence refueling of tank 335.

Method 300 may further comprise providing a fuel gauge 345 which communicates with device 315 to show an empty fuel tank 335 at a predetermined fuel level 320 to promote early refueling. This allows method 300 to accomplish tricking operator 150, who reads fuel gauge 345, into believing that fuel tank 335 is empty. Fuel gauge 345 may indicate the fuel level by a needle, by a numerical display, or may even use a light to indicate that tank 335 is empty.

Method 300 may further comprise providing a speaker 385 and emulating sounds of engine 305 stalling with speaker 385 when fuel is at predetermined fuel level 320. Speaker 385 may be incorporated in an integrated vehicle audio system 386, or be a separate speaker used only in connection with device 315. The sounds emulating a stalling engine may be stored on a compact disk, a cassette, a hard drive or any other media storage device. The emitted sound of speaker 385 may be the sound of the particular engine type that is located in vehicle 301, or the generic sounds of any engine stalling.

Method 300 may further comprise calculating an actual remaining fuel level in tank 335 by taking the average of several readings 311 to determine the actual remaining fuel level of motor vehicle 301. This will prevent any particularly low reading 311 below the predetermined level 320 only due to the sloshing of fuel in the tank 335 from inclines, turns, or accelerations, to cause device 315 to initiate the simulation of motor vehicle 301 running out of fuel.

Method 300 may further comprise interrupting an ignition spark 390 of engine 305 of a vehicle 301 when the actual volume of fuel in fuel tank 335 is at predetermined level 320 greater than zero. This interruption simulates fuel starvation to engine 305. With the power to the ignition interrupted, the sparks plugs will not spark and the engine will no longer function. Therefore, intermittently interrupting the power supply to the ignition system will cause vehicle 301 to hesitate, lurch and sputter, much like a vehicle with an engine that is deprived of fuel.

Method 300 may comprise reducing airflow of throttle 375 thereby causing power loss when the actual level of fuel in fuel tank 335 is at a predetermined level 320 greater than zero to simulate fuel starvation to engine 305. Device 315 may intercept the digital signal, for example, sent by throttle pedal 370 to throttle body 375. Device 315 may instead promulgate a signal to throttle body 375 that causes substantially less, or no air to engine 305. This may cause vehicle 301 to be unresponsive to an operator 150 who compresses throttle pedal 370, simulating vehicle 301 running out of fuel.

Finally, method 300 may comprise pulsation a braking system 360 of motor vehicle 301 to slow acceleration when the actual level of fuel in fuel tank 335 is at a predetermined level 320 greater than zero, to simulate fuel starvation to engine 305. For example, if brake system 360 is a digital anti-lock brake system (ABS) then device 315 may intercept the digital signal or create a digital signal to initiate unexpected braking. This will also cause vehicle 301 to falter as though it was running out of fuel.

I claim:

1. An apparatus to simulate fuel loss to a motor comprising:
a fuel level monitor; and
a device in communication with said monitor, wherein said device intermittently simulates fuel loss conditions when said fuel level monitor measures fuel to be at a predetermined fuel level by intermittently interrupting power to an ignition system, wherein the predetermined fuel level is greater than zero.

2. The apparatus of claim 1, wherein when the device intermittently simulates fuel loss conditions, the device includes an ignition relay switch configured to cut off voltage at an ignition coil of a vehicle.

3. The apparatus of claim 1, wherein when the device intermittently simulates fuel loss conditions, the device causes the motor to no longer function for a period of at least a second.

4. The apparatus of claim 1 further comprising an accelerometer, said accelerometer in communication with said device.

5. The apparatus of claim 2 wherein said device includes a program to calibrate said signal of said fuel level monitor to an actual fuel level present in a fuel tank.

6. The apparatus of claim 1 further comprising:
a fuel gauge wherein said fuel gauge is in communication with said device and indicates an empty fuel tank when said fuel tank contains said predetermined level of fuel.

7. The apparatus of claim 1, wherein said device is a microprocessor.

8. The apparatus of claim 1, wherein said device intermittently simulates fuel loss conditions when said fuel level monitor measures fuel to be at the predetermined fuel level, causing the vehicle to sputter.

9. The apparatus of claim 1, wherein said device modulates a brake system to initiate unintended braking impulses to mimic fuel starvation to said motor when said fuel level monitor measures fuel to be at said predetermined level of fuel.

10. The apparatus of claim 1, wherein said device overrides a throttle pedal signal causing a throttle body to reduce the amount of air to said motor to mimic fuel starvation to said motor when said fuel level monitor measures fuel to be at said predetermined level of fuel.

11. A device for imitating the effect of fuel loss to an engine comprising:
a sensor wherein said sensor measures a volume of fuel present in a fuel tank;
a microprocessor in communication with said sensor wherein said microprocessor is activated when the fuel volume measured by said sensor reaches a predetermined value greater than zero;
a fuel gauge in communication with said microprocessor wherein said fuel gauge is adjusted to display that said fuel tank is empty when the volume of fuel present is below said predetermined value; and
a device in communication with said sensor, wherein said device intermittently simulates fuel loss conditions when said monitor measures fuel to be at the predetermined fuel level by intermittently interrupting power to an ignition system.

12. The device of claim 11, wherein when the device intermittently simulates fuel loss conditions, the device includes an ignition relay switch configured to cut off voltage at an ignition coil of a vehicle.

13. The device of claim 11, wherein when the device intermittently simulates fuel loss conditions, the device causes the motor to no longer function for a period of at least a second.

14. A method for simulating the effect of a motor vehicle running out of fuel comprising:
providing a microprocessing device in communication with a motor vehicle, the motor vehicle having an engine and a fuel level sensor; and
intermittently simulating fuel starvation with said microprocessing device to said engine at a predetermined fuel level to encourage refueling by intermittently interrupting power to an ignition system, wherein the predetermined level is greater than zero.

15. The method of claim 14 further comprising:
providing a fuel gauge, wherein said gauge communicates with said microprocessing device to show an empty fuel tank at a predetermined fuel level to promote early refueling.

16. The method of claim 14 further comprising:
providing a speaker; and
emulating sounds of said engine stalling with said speaker when fuel is at a predetermined level.

17. The method of claim 15 further comprising:
calculating an actual remaining fuel level in a tank by taking the average of several readings to determine the actual remaining fuel level of a specific motor vehicle.

18. The method of claim 14 further comprising:
providing an ignition relay switch;
intermittently cutting off, by the ignition relay switch, an ignition spark of an engine of a vehicle when the actual level of fuel in said fuel tank is at said predetermined fuel level greater than zero, said interruption to simulate fuel starvation to said engine.

19. The method of claim 18 further comprising:
intermittently cutting off voltage at an ignition coil of the vehicle by the ignition relay switch.

20. The method of claim 14 further comprising:
causing the vehicle to sputter.

* * * * *